(12) United States Patent
Ónody (10) Patent No.: US 7,212,068 B2
(45) Date of Patent: May 1, 2007

(54) TUNABLE SALLEN-KEY FILTER STAGE AND FILTER ASSEMBLY

(75) Inventor: Péter Ónody, Budapest (HU)

(73) Assignee: Integration Associates Inc., Mountain View, CA (US)

( * ) Notice: Subject to any disclaimer, the term of this patent is extended or adjusted under 35 U.S.C. 154(b) by 15 days.

(21) Appl. No.: 10/817,499

(22) Filed: Apr. 2, 2004

(65) Prior Publication Data

US 2005/0237107 A1    Oct. 27, 2005

(51) Int. Cl.
    *H03K 5/00*    (2006.01)
(52) U.S. Cl. .................................. 327/553; 325/552
(58) Field of Classification Search ......... 327/552–559
    See application file for complete search history.

(56) References Cited

U.S. PATENT DOCUMENTS

| | | | | |
|---|---|---|---|---|
| 4,785,253 A | * | 11/1988 | Hughes | 327/553 |
| 4,983,931 A | | 1/1991 | Nakano | |
| 5,117,199 A | * | 5/1992 | Wang et al. | 330/252 |
| 5,418,492 A | | 5/1995 | Wang et al. | |
| 6,097,244 A | | 8/2000 | Chen | |
| 6,100,766 A | | 8/2000 | Segawa et al. | |
| 6,137,375 A | * | 10/2000 | Li | 331/175 |
| 6,407,627 B1 | | 6/2002 | Martin | |
| 6,593,802 B2 | * | 7/2003 | Mariani et al. | 327/553 |
| 6,646,498 B2 | * | 11/2003 | Mohieldin et al. | 327/553 |
| 6,677,814 B2 | * | 1/2004 | Low et al. | 327/554 |
| 6,710,644 B2 | * | 3/2004 | Duncan et al. | 327/558 |
| 6,803,813 B1 | * | 10/2004 | Pham | 327/553 |
| 6,842,710 B1 | * | 1/2005 | Gehring et al. | 702/107 |

FOREIGN PATENT DOCUMENTS

| | | |
|---|---|---|
| EP | 0549354 A | 6/1993 |
| EP | 1326336 A | 7/2003 |

OTHER PUBLICATIONS

Peng-Un Su, et al. "A Dual-Band Enhanced Harmonic Rejection Filter for Modulators in GSM and DCS Transmitters" European Solid-State Circuits, 2003. ESSCIRC '03, Conference on Sep. 16-18, 2003, Piscataway, NJ, USA, IEEE, Sep. 16, 2003, pp. 663-666, XP010678502, ISBN 0-7803-7995-0.

Elwan H. et al., "A New Generation of Global Wireless Compatibility", IEEE Circuits and Devices Magazine, IEEE Inc. New York, US vol. 17, No. 1, Jan. 1, 2001, pp. 7-19, XP001102313, ISSN: 8755-3996.

(Continued)

*Primary Examiner*—Dinh T. Le
(74) *Attorney, Agent, or Firm*—Francissen Patent Law, P.C.; Vernon W. Francissen (57) ABSTRACT

Disclosed is a filter circuit assembly that includes a filter stage with a variable resistor and a resistor/capacitor (RC) oscillator. A controlling output of the RC oscillator controls the value of the variable resistor. The RC oscillator itself also includes a variable resistor. The controlling output of the RC oscillator also controls the value of the variable resistor of the RC oscillator. The structure of the variable resistor of the filter stage is substantially the same as the structure of the variable resistor of the RC oscillator.

25 Claims, 6 Drawing Sheets

OTHER PUBLICATIONS

Wang et al., "Methodology for Building Tunable Integrated Low-pass Analog Filters", IBM Technical Disclosure Bulletin, IBM Corp., New York, US, Oct. 1, 1992, pp. 103-106, XP000312902, ISSN: 0018-8689.

Sallen R.P. et al, "A Practical Method of Designing RC Active Filters", IRE Transactions on Circuits Theory, IEEE Inc., New York, US, vol. 2, Mar., 1955, pp. 51-62, XP001026856.

Chao-Shiun Wang et al., "A CMOS Low-IF Programmable Gain Amplifier with Speed-enhanced DC Offset Cancellation", ASIC, 2002. Proceedings, 2002 IEEE Asia Pacific Conference on Aug. 6, 2002, pp. 133-136, XP010602811, ISBN 0-7803-7363-4.

Search Report-European Application #05252079.8-2215, dated Sep. 5, 2006.

Yannis P. Tsividis, "Integrated Continuous-Time Filter Design-An Overview", 8107 IEEE Journal of Solid-State Circuits, IEEE Service Center, Piscataway, NJ, US, vol. 29, No. 3, Mar. 1, 1994, pp. 166-176, XP000452103, ISSN:0018-9200.

* cited by examiner

TUNABLE SALLEN-KEY FILTER STAGE AND FILTER ASSEMBLY

FIELD OF THE INVENTION

The invention relates to a tunable Sallen-Key filter stage, and a filter assembly comprising such a filter stage.

BACKGROUND OF THE INVENTION

The use of Sallen-Key type filters is well-known for use in various applications. A typical Sallen-Key filter has four key elements: A serially connected resistor pair, an output amplifier, and two capacitors. The resistor pair is connected in series at an input of the amplifier. One of the capacitors is a feedback capacitor, connected between the output of the capacitor and a node between the resistor pair. The other capacitor is connected between the amplifier input and ground. Often, the circuit is symmetric, in a differential configuration, so that a second resistor pair is connected in series to a parallel input of the output amplifier, with a corresponding second feedback capacitor in the parallel branch. It is also known to employ an input buffer before the actual filter, in order to provide a high input resistance to the circuit and at the same time to separate the filter resistors from the output resistance of the previous circuits. An advantage of this filter type is that it may be easily implemented on a chip, and it is also suitable for multistage filter assemblies, such as those commonly used in wireless applications.

Recently, a number of known electronic devices have entered the market in a portable, battery-operated version. At the same time, many electronic devices have been equipped with wireless features, for example for communicating data between an outdoor sensor and an indoor receiver unit. All these applications require circuits which should have low operating voltage and low power consumption. Operating voltages as low as 1.5 V are required, so that even a single battery may power the device. Low power consumption is required for the very same reason.

The requirements for these low-power devices conflict with some of the traditional principles of circuit design. For example, in an amplifier circuit with a separate input buffer stage it is common to use multiple levels of transistors. Integrated circuit (IC) chip transistors are often FETs or MOSFETs, which each need an operating voltage of about 1.2–1.3 V. This means that two transistors in series between the power supply voltage $V_{dd}$ and ground require at least 2.4–2.6 V for operation.

A further requirement of IC is a capability for process compensation. This may be realized by providing variable resistors or capacitors in the circuit. Since the Sallen-Key filter is tunable, further variable elements are also needed to perform the tuning of the circuit.

U.S. Pat. No. 5,418,492 to Wang et al. discloses a fully differential Sallen-Key type filter, which contains a unity gain follower instead of an operational amplifier (op-amp). The transistors of the filter are NPN devices, and the unity gain follower contains two transistors in series between Vdd and ground, accordingly the operating voltage must be 3 V or above. Process compensation is not addressed.

U.S. Pat. No. 6,097,244 to Chen discloses a linear and tunable filter, designed for a 3 V supply voltage. The filter is provided with a voltage controlled oscillator (VCO), which controls variable capacitors with a successive approximation register (SAR), and thereby adjusts the capacitance of the circuit. The capacitance in the VCO is also adjusted. Further, variable resistors are also provided, so both capacitance and resistance are adjusted in an interdependent manner.

U.S. Pat. No. 6,407,627 to Martin discloses a tunable Sallen-Key filter, which includes an adjustable resistor ladder. The filter is tuned by switching resistors in the ladder.

SUMMARY OF THE INVENTION

In an embodiment of the present invention, there is provided a Sallen-Key type differential filter circuit which comprises an amplifier part having a positive and negative input, and a positive and negative output. First and second resistors are connected in series with the positive input of the amplifier part. There is a first node between said first and second resistors. The second resistor is connected between the first resistor and the positive input of the amplifier part. Third and fourth resistors are connected in series with the negative input of the amplifier part. There is a second node between said third and fourth resistors. The fourth resistor is connected between the third resistor and the negative input of the amplifier part. A capacitor is connected between the positive and negative inputs of the amplifier part, and further first and second feedback capacitors are connected between the first and second nodes and the positive and negative outputs of the amplifier part. The filter further comprises an input buffer part having a positive and a negative output. The input buffer part further comprises a first buffer output resistor associated to the positive output of the input buffer part, and a second buffer output resistor associated to the negative output of the input buffer part. The first and third resistors comprise the first and second buffer output resistors, respectively. The invention also concerns a filter with multiple filter stages, where a filter stage is constructed as explained above.

According to another aspect of the invention, there is also provided a filter circuit assembly comprising a filter stage with a variable resistor and a resistor/capacitor (RC) oscillator. A controlling output of the RC oscillator controls the value of the variable resistor. The RC oscillator itself also comprises a variable resistor. The controlling output of the RC oscillator also controls the value of the variable resistor of the RC oscillator. The structure of the variable resistor of the filter stage is substantially the same as the structure of the variable resistor of the RC oscillator.

The disclosed tunable filter may be operated with a low supply voltage such as 1.5 V, while still providing acceptable filtering characteristics. The buffer and amplifier stages within the circuit both have a sufficiently high input resistance, significantly higher than the output resistance of the preceding stages, but all the switching elements can operate close to the supply voltage. The process tolerances may be compensated with the help of the variable resistors in the filter and the DCO, and following the process compensation, the filter can be tuned with the variable capacitors. The DCO can lock the filter frequency to a predetermined frequency, such as the frequency of the reference oscillator, and at the same time the process compensation will be effected. Thereafter, the tuning of the filter may be performed with the variable capacitors, independently of the resistors. Due to the identical structure of the variable resistors in the DCO and the filter, the filter frequency will be proportional to the DCO frequency.

BRIEF DESCRIPTION OF DRAWINGS

The invention will be now described with reference to the enclosed drawings, where.

DETAILED DESCRIPTION OF THE INVENTION

The present invention is directed towards a tunable Sallen-Key filter that may operate on voltages supplied by a single battery, while maintaining the advantageous technical features of known filters, such as the possibility of process compensation and tuning. Therefore, one aspect of the present invention provides a tunable filter with a low operating voltage, which provides filter tuning and process compensation calibration independently from one another. Another aspect of the present invention provides for a filter circuit that may operate from a low level supply voltage, such as 1.5 V and that may be implemented on a semiconductor chip with standard active and passive chip elements, such as field effect transistors (FET) or metal oxide semiconductor FET (MOSFET) transistors.

Figure 1:
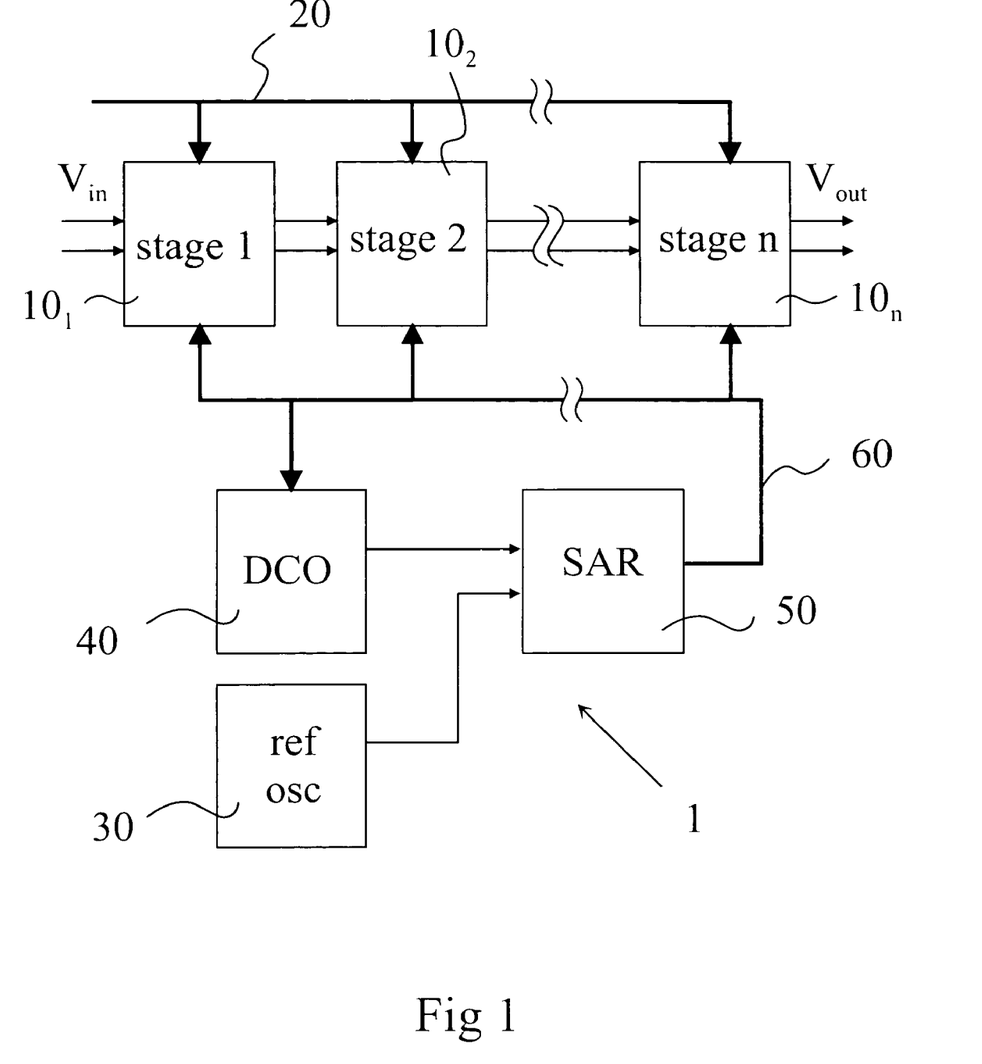
FIG. 1 is a functional diagram of one embodiment of a filter assembly in accordance with the present invention.

Referring now to FIG. 1, the proposed filter circuit 1 is a multistage filter that includes a number of filter stages $10_1$, $10_2 \ldots 10_n$. The filter stages $10_1$, $10_2$–$10_n$ are Sallen-Key type fully differential filters, with a filter architecture as explained below with reference to FIGS. 3 and 4. The filter circuit 1 may be tuned by tuning the filters stages $10_1$, $10_2$–$10_n$ through the bus 20, which adjusts variable capacitors within the filter stages $10_1$, $10_2$–$10_n$. A reference frequency is provided to the filter by a reference oscillator 30. A successive approximation register (SAR) circuit 50 compares the frequency of the reference oscillator 30 and the frequency of a digitally controlled oscillator (DCO) 40. The output of the SAR 50 is connected through bus 60 to the variable resistors in the filters stages $10_1$, $10_2$–$10_n$ and in the DCO 40.

Figure 2:
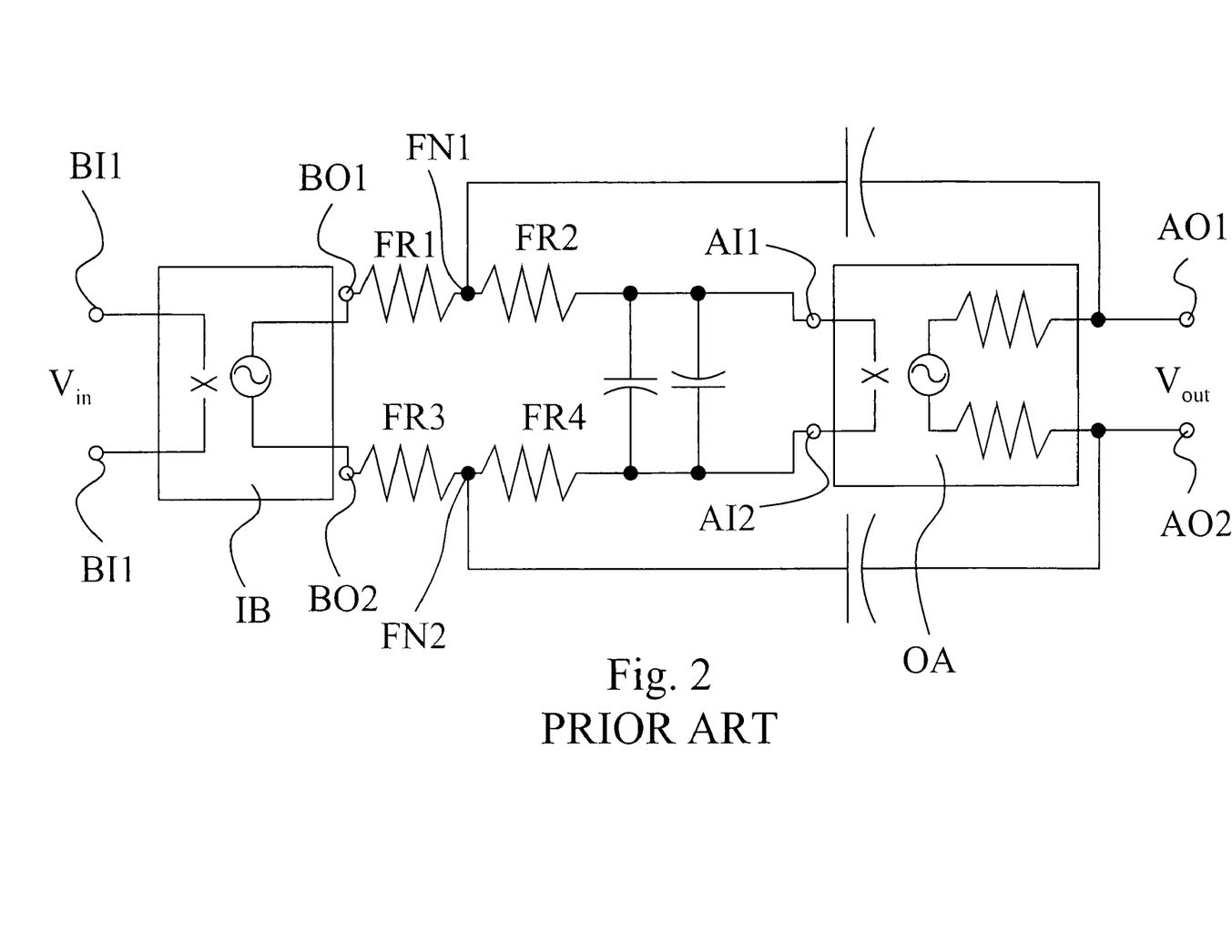
FIG. 2 is a functional circuit diagram illustrating an example of a prior art Sallen-Key filter.

In order to better illustrate the features of the filter design according to the invention, it is helpful to compare it with a known filter. This latter is shown in FIG. 2, which is a functional circuit diagram of a prior art differential Sallen-Key filter. A similar filter is also disclosed, for example, in U.S. Pat. No. 5,418,492 to Wang et al. The prior art Sallen-Key filter has an output amplifier OA, with positive and negative inputs, substantially corresponding to the nodes AI1 and AI2 in FIG. 2. The output amplifier OA has positive and negative outputs (nodes AO1 and AO2). First and second filter resistors FR1 and FR2 are connected in series with the positive input (node AI1) of the output amplifier OA, and there is a feedback node FN1 between the first filter resistor FR1 and the second filter resistor FR2, so that the second filter resistor FR2 is connected between the first filter resistor FR1 and the positive input, i.e. node AI1 of the output amplifier OA. In this manner the filter resistors FR1 and FR2 constitute an input resistor pair of the filter. In a standard design example, FR1=FR2.

In a symmetric fashion another resistor pair consisting of the third and fourth filter resistors FR3 and FR4 are connected in series with the negative input of the output amplifier OA, the negative input corresponding to the node AI2. There is another filter node FN2 between the third filter resistor FR3 and the fourth filter resistor FR4, so that the fourth filter resistor FR4 is connected between the third filter resistor FR3 and the negative input of the output amplifier OA (node AI2).

As it is known in the art, the main parameters of a Sallen-Key filter, particularly its corner frequency, are partly determined by the values of the serial resistor pair connected to the inputs of its amplifier, and also by the ratio of the values of the pair. The filter nodes FN1 and FN2 between the resistors of the resistor pair are distinguished because they serve as the connection point for the feedback capacitors of the filter. It is also known in the art to combine the Sallen-Key filter with an input buffer, in order to separate the first and third filter resistors FR1 and FR3 from the output impedance of the preceding stage, which may be either unknown or quite high. This input buffer IB is also indicated in FIG. 2. In practice, the input buffer IB is an amplifier with unity gain. Traditionally, the output resistance of the input buffer IB is designed to be minimal, or at least negligible compared with the input resistance of the subsequent stage. The output impedance of the input buffer IB appears on the output nodes marked as BO1 and BO2 in FIG. 2.

Figure 3:
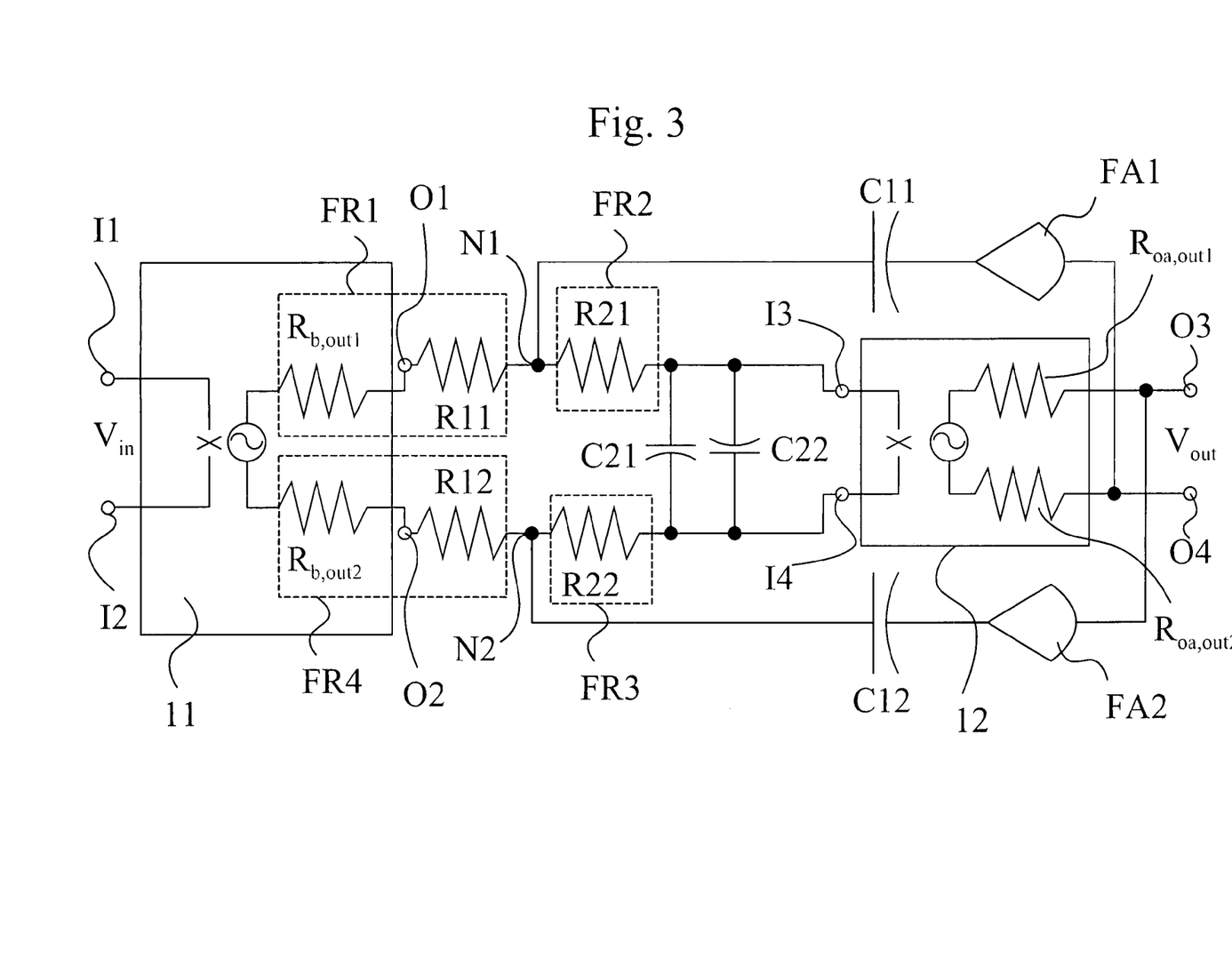
FIG. 3 is a functional circuit diagram illustrating one embodiment of a filter stage of the filter assembly of FIG. 1.

Turning now to FIG. 3, there is shown a functional circuit diagram of a differential Sallen-Key filter used in the filter stages of the filter circuit of FIG. 1. The elements of this filter largely correspond to the functional elements of the known Sallen-Key filter shown in FIG. 2. The filter of FIG. 3 has an amplifier part 12, and the amplifier part 12 has positive and negative inputs, substantially corresponding, to the nodes 13 and 14 in FIG. 3. Two resistors R11 and R21 are connected in series with the positive input (node 13) of the amplifier part 12. There is a node NI between the resistor R11 and the resistor R21, so that the resistor R21 is connected between the resistor R11 and the positive input of the amplifier part 12. In this manner resistors R11 and R21 constitute an input resistor pair of the filter, with resistor R21 substantially corresponding to the second filter resistor FR2 of FIG. 2.

In a symmetric fashion, another resistor pair consisting of the resistors R12 and R22 are connected in series with the negative input of the amplifier part 12, the negative input corresponding to the node 14. There is another node N2 between the resistor R12 and the resistor R22, so that the resistor R22 is connected between the resistor R12 and the negative input of the amplifier part 12 (node 14). Again, resistors R12 and R22 constitute the other input resistor pair of the filter, with resistor R22 substantially corresponding to the fourth filter resistor FR4 of FIG. 2.

As mentioned above, the main parameters of the filter are determined by the values of the serial resistor pairs connected to the inputs of its amplifier. As will be explained below, the filter of FIG. 3 is designed so that the resistor pair also includes additional resistors, not only the resistors R11 and R21. The same applies for the other branch of the filter, i.e. beside the resistors R12 and R22, further elements must be taken into account when calculating the frequency of the filter.

An essential feature of a differential Sallen-Key filter is a capacitor connected between the inputs of the amplifier.

Also in the filter shown in FIG. 2 there are two symmetric capacitors C21 and C22 switched in parallel between the nodes 13 and 14 of the amplifier part 12. Though instead of the two capacitors C21 and C22 a single capacitor would also be sufficient, two symmetrically designed capacitors are used to make the differential filter symmetric, considering the fact that single chip-implemented capacitors are typically slightly asymmetric.

Another feature of a Sallen-Key filter is the feedback capacitors between the amplifier outputs and the nodes between the serial resistor pairs. Therefore, there is a feedback capacitor C11 connected between the node N1 and the node O4, i.e. the negative output of the amplifier part 12. Another feedback capacitor C12 is connected between the node N2 and the node O3, i. e. the positive output of the amplifier part 12. The feedback capacitors C11 and C12 are separated from the output resistors of the amplifier part 12 (the latter symbolized by resistors $R_{oa,out1}$, $R_{oa,out2}$) by feedback amplifiers FA1 and FA2. These are also unity gain amplifiers.

It must be noted that the connection of the feedback capacitors C11,C12 is somewhat arbitrary, in the sense that the filter could also work if the feedback capacitors C11,C12 were not cross-connected, i.e. if the node N1 were connected to the node O3 through a capacitor, and symmetrically the node N2 were connected to the node O4 through another capacitor. The final choice is determined by the stability of the filter, and the phase behavior of the amplifier part 12 and the feedback amplifiers FA1 and FA2.

In order to separate the filter itself from the previous stages or other input circuits, the filter circuit shown in FIG. 3 also comprises all input buffer part 11. This input buffer part 11 has a pair of inputs (nodes I1,I2), which may be regarded as a positive and a negative input. The input buffer part 11 also has a positive output and a negative output, represented by nodes O1 and O2. A first buffer output resistor $R_{b,out1}$ is associated to the positive output (node O1) of the input buffer part 11, and a second buffer output resistor $R_{b,out2}$ is associated to the negative output (node O2). In this manner, the buffer output resistors $R_{b,out1}$, $R_{b,out2}$ determine the output impedance of the input buffer part 11. More importantly, in the proposed filter design, the buffer output resistors $R_{b,out1}$, $R_{b,out2}$ also contribute to the Sallen-Key filter, in the sense that resistor R11 and the first buffer output resistor $R_{b,out1}$ together play the same role in the filter of FIG. 3 as the first filter resistor FR1 in the filter of FIG. 2. In other words, the first filter resistor FR1 determining the parameters of the Sallen-Key filter includes not only the resistor R11, but also the first buffer output resistor $R_{b,out1}$. Similarly, resistor 12 and the second buffer output resistor $R_{b,out2}$ together play the same role in the filter of FIG. 3 as the third filter resistor FR3 in the filter of FIG. 2., so that the third filter resistor FR3 comprises both the resistor R12 and the second buffer output resistor $R_{b,out2}$.

Figure 4:
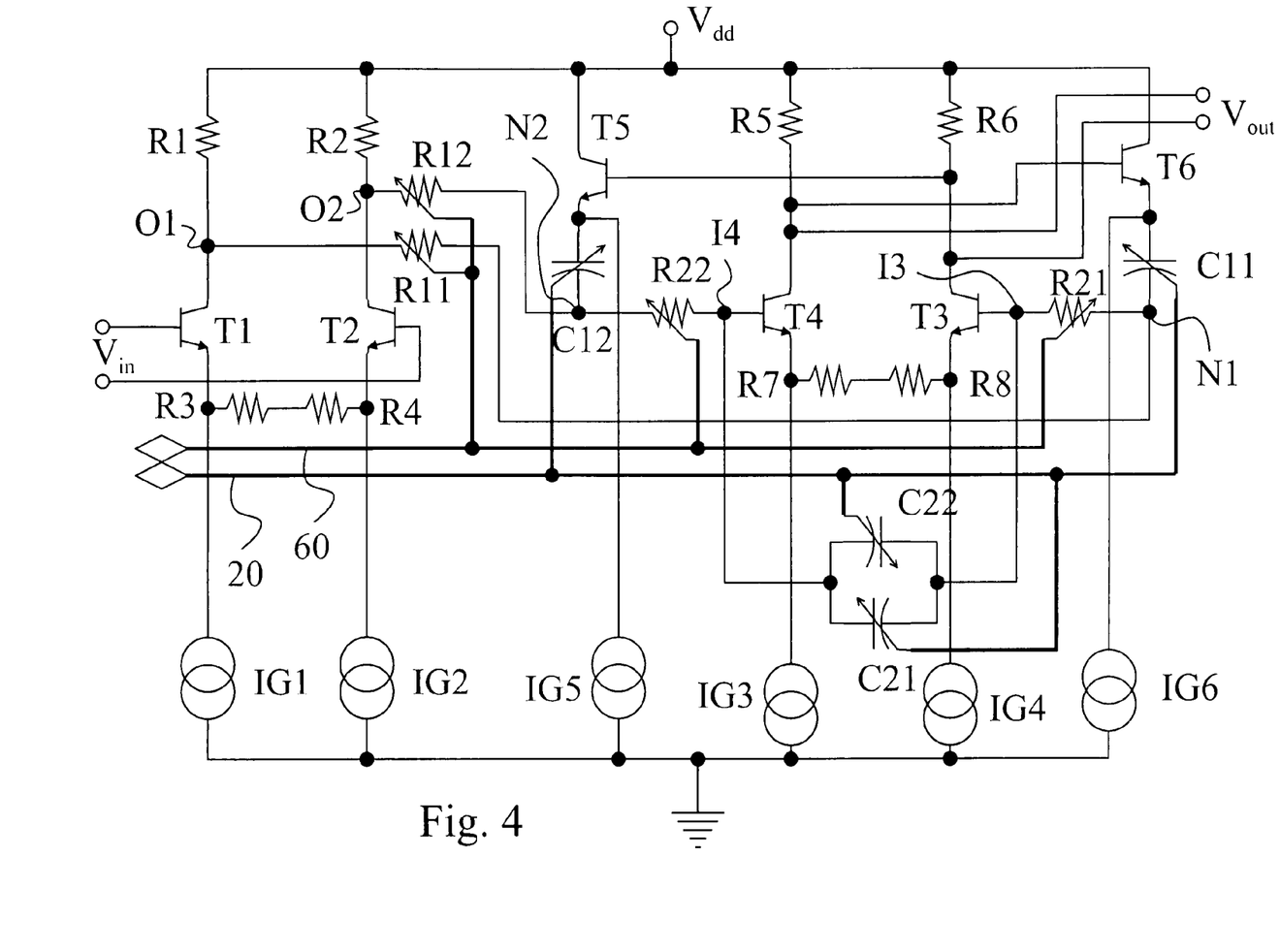
FIG. 4 is a circuit diagram illustrating one possible embodiment of the filter stage shown in FIG. 3.

As it is best perceived from FIG. 4, in a proposed embodiment of the filter, the resistor R11 is connected in series with the resistor corresponding to the first buffer output resistor $R_{b,out1}$, while the resistor R12 is connected in series with the resistor corresponding to the second buffer output resistor $R_{b,out2}$.

In this manner, the potential of the resistors R11 and R12 is sufficiently close to the supply voltage, perhaps a few hundred mV lower, as compared with known solutions, where the resistors R11 and R12 were lower with at least one base-emitter voltage. This would make it difficult or impossible to switch the resistors in the resistor bank. Instead, in the proposed solution, the transistors of the input buffer stage are still able to separate the filter from the output resistance of the preceding stage, however, the resistors $R_{b,out1}$, $R_{b,out2}$ should be calculated into the filter.

FIG. 4 shows an exemplary embodiment of the Sallen-Key type filter circuit shown in FIG. 3. Where applicable, the same elements have the same reference numbers.

The input buffer consists of the transistors T1, T2, which may be realized as bipolar transistors, and the resistors R1, R2, R3 and R4. The input buffer provides unity gain to the input signal, before the actual filter. The gain of the input buffer is adjusted with the ratio of the resistors, and it is normally set to unity. The resistors R3 and R4 strongly degenerate the differential pair of the transistors T1,T2, and therefore the input buffer will be highly linear.

The resistors R1,R2 substantially determine the output resistance of the input buffer stage, because transistors T1,T2 have a very large resistance, and thus may be ignored, since seen from the output of the input stage (corresponding to nodes O1 and O2), they are connected in parallel with the resistors R11, R12, the latter partly constituting the first and third filter resistors of the actual filter stage. As it will be explained below, resistors R11, R12 are variable.

The emitters of the input buffer transistors T1,T2 are connected to ground through current generators IG1 and IG2. The current generators may be realized with FET transistors, and they ensure the necessary current independently from the supply voltage. so that the circuit may operate between 1.5–5 V, without any significant change in its properties.

The amplifier of the filter stage itself is constituted by the transistors T3 and T4, and the resistors R5, R6, R7 and R8 as a differential amplifier. The amplifier has a fixed gain, which is adjusted by the ratio between the resistors, provided that the differential pair provides sufficiently large amplification.

The input serial resistor pairs of the filter corresponding to the first, second, third and fourth filter resistors FR1–FR4 of FIG. 2 are constituted by the resistors R11,R21, R12 and R22, respectively, all being variable resistors, the value of which is controlled through the bus 60. The capacitors C21, C22 and the first and second feedback capacitors C11, C12 of the filter are also variable, controlled through the bus 20.

The filter stage is designed as a fully differential filter, and therefore it is less sensitive to noise. As mentioned above, the output resistors R1, R2 of the input buffer stage are also part of the filter. Seen from the filter stage, R1 is connected in series with R11, and R2 is also connected in series with R12, hence each of these serial resistor pairs may act as a single resistor in the filter. In this manner, the filter itself consists of the resistors R1, R11, R21, and in the other branch R2, R21, R22, and further of the capacitors C21, C22 and the feedback capacitors C11, C12. The capacitors C21, C22 are parallel for the sake of symmetry. In theory, they could be replaced by a single capacitor.

The feedback amplifiers FA1 and FA2 of FIG. 3 are realized by the transistors T5 and T6. These have a common collector, and they separate the feedback capacitors C11, C12 from the output resistors R5, R6 of the output amplifier stage. The emitters of the transistors T3–T6 are connected to ground through current generators IG3–IG6, to compensate for the fluctuations of the supply voltage $V_{dd}$.

As a result of this configuration, all of the transistors T1–T6, which may be P-MOS transistors, are sufficiently close to the supply voltage for the purposes of proper operating voltage, in the sense that there are no additional transistors between the collectors of the transistors T1–T6 and the supply voltage $V_{dd}$.

Figure 6:
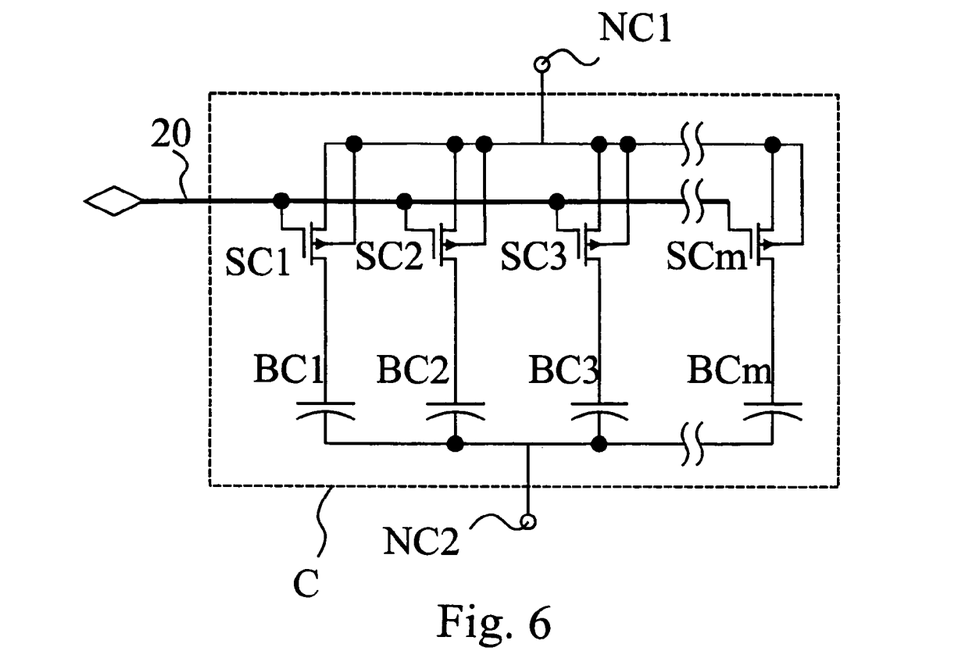
FIG. 6 is a circuit diagram illustrating one embodiment of a variable capacitor used in the circuit of FIG. 4.

As mentioned above, the capacitors C21, C22 and the first and second feedback capacitors C11, C12 of the filter are also variable. The structure of such a variable capacitor C is shown in FIG. 6. The variable capacitor C is connected between the nodes NC1 and NC2, where the node NCI is on the higher potential. The variable capacitor C is effectively a capacitor bank consisting of parallel switched capacitors BC1–BCm, being switched individually on or off by the capacitor switches SC1–SCm. These latter may be realized with MOSFET transistors. Particularly with the feedback capacitors C11, C12 it is important to switch them from the correct side. As shown in FIG. 6, the capacitors BC1–BCm of the capacitor bank are switched from the side of the higher voltage node NC1, so that the capacitor switches SC1–SCm are also close to $V_{dd}$. In this manner the switches, e. g. MOSFET transistors, are at a sufficiently high potential to operate correctly. Note that the gates of the MOSFET transistors constituting the capacitor switches SC1–SCm may be driven through the bus 20 at a quite high voltage, in effect close to $V_{dd}$ independently from the potential of the nodes NC1 and NC2.

Figure 7:
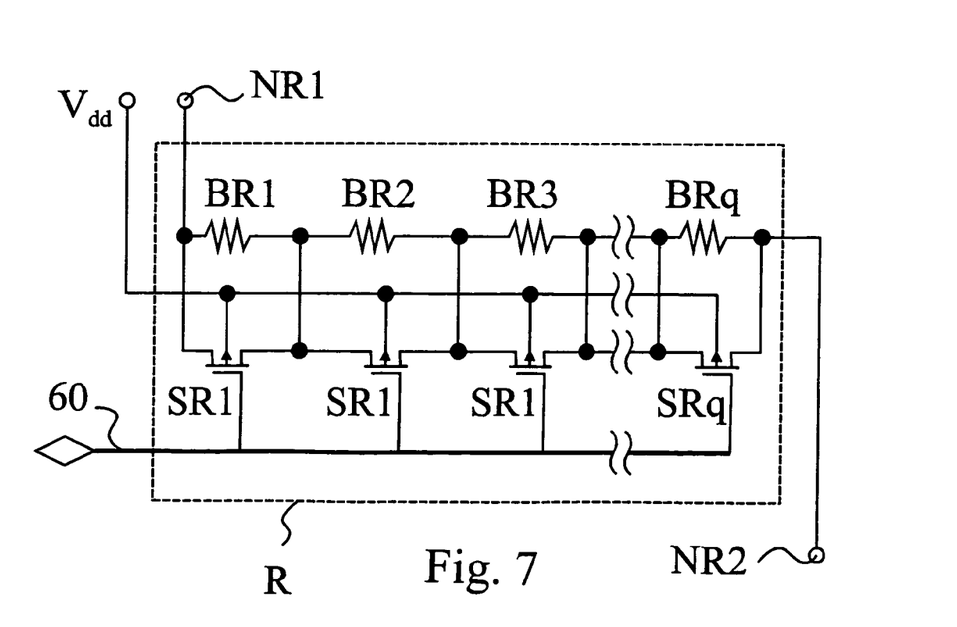
FIG. 7 is a circuit diagram illustrating one embodiment of a variable resistor used in the circuit of FIG. 4 or FIG. 5.

The resistors R11, R21, R12 and R22 are variable resistors. The structure of such a variable resistor R is shown in FIG. 7. The variable resistor R is connected between the nodes NR1 and NR2, where the node NRA is at the higher potential. The variable resistor R is effectively a resistor bank consisting of serially connected resistors BR1–BRq, being switched individually on or off by the resistor switches SR1–SRq. These latter may also be realized with MOSFET transistors. The resistors BR1–BRq are connected in parallel with the switches SR1–SRq of the respective resistor, between the higher voltage node NR1 and the lower voltage node NR2, so that a resistor is "on" when the corresponding switch is open. When a resistor must be switched off, the associated switch closes, and short-circuits the resistor.

The serially connected resistors BR1–BRq within the resistor bank R are connected between a high voltage node NR1 and the switch of the subsequent resistor. In effect, the high voltage node NR1 will be sufficiently close to $V_{dd}$, because only other resistors are connected between the node NR1 and $V_{dd}$, but no other transistor. For the same reasons the sources of all resistor switches SR1–SRq will be close to $V_{dd}$. For example, the j-th switch SRj is separated from the voltage on the node NR1 only by the total resistance of the preceding resistors BR1–BRj-1, so there are no other transistors between $V_{dd}$ and the source of resistor switch SRj. The same applies for the ground and the drain of the resistor switches SR1–SRq. This means that all resistor switches SR1–SRq will practically operate between $V_{dd}$ and ground, and e. g. the p-type MOSFET transistors are at a sufficiently high potential to operate correctly, even with a low supply voltage $V_{dd}$. As with the capacitor bank, the gates of the MOSFET transistors constituting the resistor switches SR1–SRq may be driven through the bus 60 at a quite high voltage, in effect close to $V_{dd}$, independently from the potential of the nodes NR1 and NR2.

The corner frequency $f_{SK}$ of a Sallen-Key filter is roughly proportional to 1/FR, if FR≈FR1≈FR2≈FR3≈FR4, i.e. the resistors in the filter have approximately the same value. This fact is exploited in another aspect of the invention, which will be explained below.

The tuning of the filter stages $10_1$–$10_n$ is done with the help of the digitally controlled oscillator (DCO) circuit 40, via the SAR circuit 50, where the latter directly controls the bus 60. (see FIG. 1).

The DCO circuit 40 includes all RC oscillator, and the output frequency of the DCO 40 is a function of the resistor value in the RC oscillator. The resistor of the RC oscillator in the DCO 40 is variable, having a similar switchable resistor bank structure as described above. In fact, the structure of the variable resistors of the filter stages is substantially identical to the structure of the variable resistor of the RC oscillator.

Figure 5:
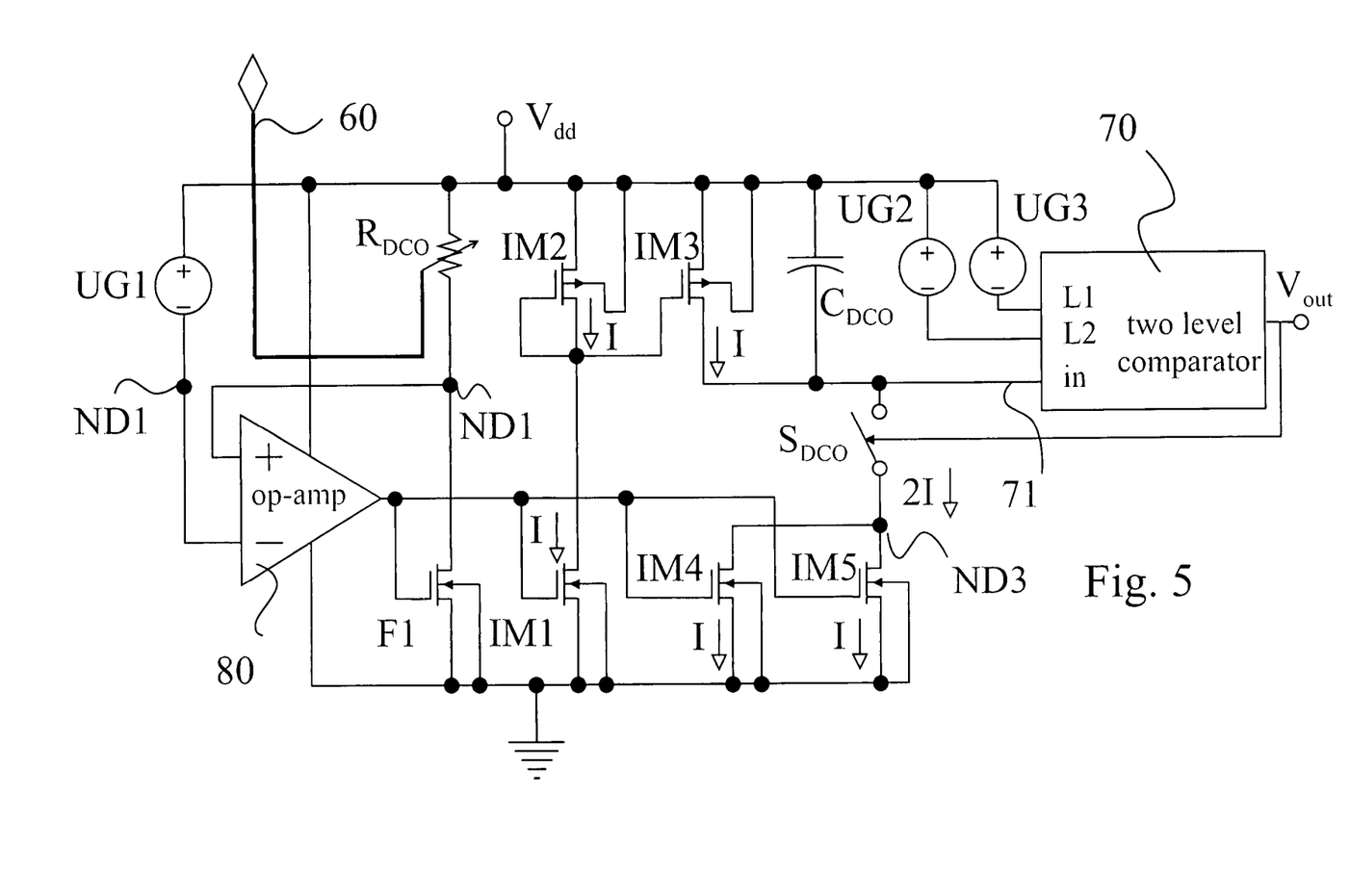
FIG. 5 is a circuit diagram illustrating one embodiment of the DCO circuit of FIG. 1.

Turning now to FIG. 5, there is shown a functional circuit diagram of a possible embodiment of a DCO circuit 40 according to the invention. This comprises an RC circuit resistor $R_{DCO}$, and an RC circuit capacitor $C_{DCO}$. The frequency of the DCO 40 is determined by the values of these elements. The resistor $R_{DCO}$ is a variable resistor, with a structure identical to the resistors R11, R12, R21, R22 in the filter stages $10_1$–$10_n$. The resistors R11, R12, R21, R22 typically have a value of a few 10 kΩ, e. g. 30 kΩ. The basic operating principle of the DCO 40 is the following: the RC capacitor $C_{DCO}$ is charged and discharged by a current being equal to the current flowing through the resistor $R_{DCO}$.

The voltage generator UG1 will indirectly establish a well-defined voltage U across the resistor $R_{DCO}$. This voltage U is transferred to $R_{DCO}$ with the help of the operation amplifier ("op-amp 80"). The op-amp 80 will tune the current of the current generator F1 until the voltage difference at its inputs disappears, i. e. when the potential in the nodes ND1, ND2 are equal. In this manner a well-defined current I is generated, considering that U and $R_{DCO}$ may be considered as constants.

First, this current I is mirrored by the current mirror IM1—because its gate is on the same potential as the gate of the current generator F1—and simultaneously the current I on the current mirror IM1 is mirrored by IM2 and IM3, together constituting the current I for either charging the capacitor $C_{DCO}$, or being discharged through the switch $S_{DCO}$, together with the discharge current of the capacitor $C_{DCO}$.

The current I is also mirrored by the current mirrors IM4 and IM5, also having their gates on the same level as the gate of the current generator F1. The current mirrors IM4 and IM5 will each mirror the current I, i. e. it is mirrored twice, and therefore the current 2I will flow through the common node ND3. The mirrors are used to avoid any significant change of voltage on $R_{DCO}$, keeping in mind that $R_{DCO}$ is a resistor bank, with multiple switches. Therefore, $R_{DCO}$ would not behave linearly, so high voltage changes on $R_{DCO}$ should be avoided.

The switch $S_{DCO}$ is controlled by the output of the two-level comparator 70. Its input from line 71 is compared to input voltage levels L1 and L2. When one of the levels, say the higher level L1 is reached, the output of the two-level comparator 70 changes its output value, opening the switch $S_{DCO}$, and the capacitor $C_{DCO}$ is charged with current I, flowing from the current mirror IM3. As a result of this charge, the voltage $U_c$ across the capacitor $C_{DCO}$ increases, resulting in a lowering of the potential at the input of the two-level comparator 70. When the lower potential input level L2 is reached, the output voltage of the two-level comparator 70 resumes, closing the switch $S_{DCO}$, and the capacitor $C_{DCO}$ discharges, also with current I, because 2I will flow through the switch $S_{DCO}$, the 2I current being controlled by the current mirrors IM4 and IM5.

Again, as the capacitor $C_{DCO}$ discharges, the capacitor voltage $U_c$ will drop again, and the input of the two-level comparator 70 reaching the input voltage L1, the switch $S_{DCO}$, switches off the current 2I and the process is repeated. Accordingly, an oscillating signal will appear at the output of the two-level comparator 70, also serving as the output of the DCO 40.

The switch $S_{DCO}$ could be an N-MOSFET or P_N MOSFET pair (a so-called analog switch.)

In more detail, the output frequency of the DCO 40 shown in FIG. 5 may be calculated by the following considerations:

The current I flowing through the resistor $R_{DCO}$ is determined by the (constant) voltage U across the resistor $R_{DCO}$. This voltage U is established by the voltage generator UG1. Let us assume that the same current I will charge the capacitor $C_{DCO}$ during a time t, which will result in a charge Q on the capacitor $C_{DCO}$, generating a voltage of $U_c$ across the capacitor $C_{DCO}$. This capacitor voltage $U_c$ may be expressed as $U_c$=k U, where k is a constant. From the relations I=U/$R_{DCO}$ and It=Q=$C_{DCO}U_c$ we may write It=$C_{DCO}U_c$=$C_{DCO}$kU=$C_{DCO}$kI$R_{DCO}$, from which it follows that f~1/t=k/$R_{DCO}C_{DCO}$. In other words, the DCO 40 may be considered as an RC oscillator, even though the resistor and the capacitor do not form a connected resonant circuit as in a traditional RC oscillator. Accordingly, the frequency f of the DCO 40 will be proportional to the 1/$R_{DCO}C_{DCO}$ value, i.e. the DCO frequency will also be proportional to the filter corner frequency, because the sole resistor $R_{DCO}$ in the DCO 40 is tuned simultaneously with the resistors in the filter.

The SAR circuit 50 performs the functions of a resistor setting circuit, in the sense that it sets directly by way of the bus 60 the resistance values of the variable resistors in both the DCO 40 and in the filter stages. The SAR circuit 50 contains a successive approximation register, which changes its output until the two input frequencies—one from the DCO circuit 40, the other from the reference oscillator 30—are equal. As shown in FIG. 1, the output of the SAR 50 directly controls the bus 60, i.e. it is the SAR circuit that sets the values of the resistors in the filter stages and simultaneously in the DCO itself, because the bus 60 switches simultaneously all the resistors banks that are controlled by the bus 60, i.e. the controlled resistor banks will assume equal or at least more or less linearly proportional resistance values. In other words, the output of the RC oscillator controls the value of the variable resistors in the filter stages, but this controlling output of the RC oscillator also controls the value of the variable resistor of the RC oscillator itself. It must be noted that in the embodiment shown in the output of the RC oscillator exerts this control indirectly, through the SAR circuit 50.

As mentioned above, the variable capacitors and the variable resistors in the filter stages are controlled separately. In this manner, it is possible to first tune the filter stages $10_1$–$10_n$ to a well-defined corner frequency. At the same time, the process tolerations may also be compensated in the circuit. Due to the fact that the variable resistors in the filter and that resistor in the DCO circuit 40,which determines its frequency, have the same structure, the process tolerations can be compensated simultaneously with the tuning of the filter stages. This approach exploits the fact that in highly integrated circuits, through the exact electronic parameters of the circuit elements, such as resistance or capacitance, are difficult to control (this is why there is a need for process compensation), circuit elements having identical structure on the same chip have more or less equal values. In other words, while the values of the resistors in the resistor banks in the filter stages may have fluctuating values between chips, the identically formed resistors on the same chip will have substantially equal resistance values.

This ensures that after the frequency tuning of the DCO there is no need for a separate process compensation in the filter stages, because in the DCO the frequency tuning will also perform the process compensation in the DCO. Conversely, the process compensation in the DCO will also perform the process compensation in the filter stages, while the filter stages also remain substantially tuned to the desired frequency. Thereafter the bandwidth of the filters may be tuned through the tuning of the variable capacitors in the filter stages, independently from the corner frequency of the filter, where the latter remain tuned to the frequency of the reference oscillator.

As is clear from the discussion above, the DCO 40 shown in FIG. 5 contains a single resistor and a single capacitor only. However, designs comprising multiple resistors and capacitors are also possible. As mentioned above, the structure of this single resistor $R_{DCO}$ is identical to the resistors in the filter stages. Also, as in the filter stage circuits shown in FIGS. 4, 6 and 7, the transistors in the resistor bank and in the DCO are close to $V_{dd}$, and the gates of the MOSFET transistors are able to be operated at a sufficiently high potential.

The invention is not limited to the disclosed embodiments. Other elements, improvements and variations may also fall within the scope of the invention. For example, it will be clear for those skilled in the art that the proposed filter assembly may contain further elements beside those shown.

The invention claimed is:

1. A filter circuit assembly comprising:
   at least one filter stage, said filter stage comprising at least one variable resistor,
   a resistor/capacitor (RC) oscillator having an output, said RC oscillator further comprising at least one variable resistor;
   a successive approximation register coupled to the output of the RC oscillator and generating a control value corresponding to the output of the RC oscillator, where the control value of the successive approximation register controls the resistance of the variable resistor of the filter stage and the resistance of the variable resistor of the RC oscillator, and where the successive approximation register compares a frequency of the RC oscillator to a reference frequency to generate the control value;
   wherein the variable resistor of the filter stage and the variable resistor of the RC oscillator have a substantially identical structure, where each variable resistor structure is closely coupled to a power supply terminal of the filter circuit assembly, and the variable resistor structure comprises a plurality of resistors coupled in series with one another and a plurality of transistors, each transistor coupled in parallel with a corresponding one of the plurality of resistors, where a gate of each transistor is coupled to a corresponding bit of the successive approximation register.

2. The assembly of claim 1, wherein the RC oscillator further comprises an RC digitally controlled oscillator (DCO).

3. The assembly of claim 1, wherein voltage across the variable resistor of the RC oscillator is substantially constant, so that a substantially constant current flows through the variable resistor.

4. The assembly of claim 3, wherein the substantially constant current is mirrored by current mirrors for alternatingly charging and discharging a capacitor of the RC oscillator.

5. The assembly of claim 1, further comprising
   a reference oscillator having an output,
   a successive approximation register having a first input for coupling to the output of the RC oscillator and a second input for receiving said output of the reference oscillator to generate said control value.

6. The assembly of claim 5, wherein the controlling output of the RC oscillator delivers said frequency of the RC oscillator.

7. The assembly of claim 6, wherein the frequency of the RC oscillator is a function of the variable resistor of the RC oscillator.

8. The assembly of claim 1, wherein the frequency of the RC oscillator is proportional to the frequency of the filter stage.

9. The assembly of claim 5, wherein the successive approximation register adjusts values of the variable resistors until the frequency of the RC oscillator and the frequency of the reference oscillator assumes a predetermined proportion.

10. The assembly of claim 1, wherein said filter stage comprises multiple filter stages.

11. The assembly of claim 10, in which the at least one filter stage comprises a filter circuit, the filter circuit comprising
an amplifier part, the amplifier part having a positive input, a negative input a positive output, a negative output,
first and second resistors connected in series with the positive input of the amplifier part, having a first node between said first and second resistors, the second resistor being connected between the first resistor and the positive input of the amplifier part,
third and fourth resistors connected in series with the negative input of the amplifier part, having a second node between said third and fourth resistors, the fourth resistor being connected between the third resistor and the negative input of the amplifier part,
at least one capacitor connected between the positive and negative inputs of the amplifier part,
first and second feedback capacitor connected between the first and second nodes and the positive and negative outputs of the amplifier part,
an input buffer part, the input buffer part having a positive input a negative input, a positive output, a negative output,
the input buffer part further comprising a first buffer output resistor associated to the positive output of the input buffer part, a second buffer output resistor associated to the negative output of the input buffer part,
wherein the first and third resistors comprise the first and second buffer output resistors, respectively.

12. The assembly of claim 10, wherein the at least one filter stage comprises a variable capacitor.

13. The assembly of claim 11, wherein the variable capacitor comprises multiple switchable capacitors.

14. The assembly of claim 13, wherein the assembly is implemented on a chip.

15. The circuit assembly of claim 11, wherein said first and second output buffer resistors are connected in series with said first and third resistors, respectively.

16. The circuit assembly of claim 1, further comprising a required supply voltage of the assembly not higher than 1.5 V.

17. A method for adjusting the frequency or compensating process parameters of a Sallen-Key type filter having at least one filter stage with variable resistors, the method including the steps of
providing an RC oscillator having an output, said RC oscillator further comprising at least one variable resistor, wherein the variable resistor of the filter stage and the variable resistor of the RC oscillator have a substantially identical structure, where each variable resistor structure is closely coupled to a power supply terminal of the filter stage and the RC oscillator,
comparing a frequency of said RC oscillator with a reference frequency to generate a control value,
controlling the resistance of the variable resistor of a filter stage with the control value.
controlling the resistance of the variable resister of the RC oscillator with the control value.

18. The method of claim 17, further comprising the steps of providing a reference oscillator having an output for producing the reference frequency,
providing a successive approximation register having a first input for coupling to said output of the RC oscillator and a second input for receiving said output of the reference oscillator, and a controlling for generating the control value.

19. The method of claim 18, further comprising the step of adjusting the controlling output of the resistor setting circuit as a function of at least one of the following:
a, the frequency of the RC oscillator
b, the frequency of the reference oscillator.

20. The method of claim 19, further comprising the step of adjusting the resistances of the variable resistors until the frequency of the RC oscillator and the frequency of the reference oscillator assumes a predetermined proportion.

21. The method of claim 17, further comprising the step of employing a filter circuit with multiple filter stages, wherein a filter stages comprises
an amplifier part, the amplifier part having a positive input, a negative input a positive output, a negative output,
first and second resistors connected in series with the positive input of the amplifier part, having a first node between said first and second resistors, the second resistor being connected between the first resistor and the positive input of the amplifier part,
third and fourth resistors connected in series with the negative input of the amplifier part, having a second node between said third and fourth resistors, the fourth resistor being connected between the third resistor and the negative input of the amplifier part,
at least one capacitor connected between the positive and negative inputs of the amplifier part,
first and second feedback capacitor connected between the first and second nodes and the positive and negative outputs of the amplifier part, respectively,
an input buffer part, the input buffer part having a positive input a negative input, a positive output, a negative output,
the input butler part further comprising a first buffer output resistor associated to the positive output of the input buffer part, a second buffer output resistor associated to the negative output of the input buffer part,
the method further including the step of including the resistances of said first and second buffer output resistors in the resistances of said first and third resistors, respectively.

22. The method of claim 21, further including the step of connecting said first and second buffer output resistors in series with said first and third resistors.

23. The method of claim 17, further including the step of providing a substantially constant voltage across the variable resistor in the RC oscillator, and thereby generating a substantially constant current flowing through the variable resistor.

24. The method of claim 23, further including the step of mirroring said substantially constant current for alternatingly charging and discharging a capacitor in the RC oscillator.

25. The method of claim 17, wherein the substantially identical structure of the variable resistors comprises a plurality of resistors coupled in series with one another and a plurality of transistors, each transistor coupled in parallel with a corresponding one of the plurality of resistors, where a gate of each transistor is controlled by the output of the RC oscillator.

* * * * *